US000001797H

United States Statutory Invention Registration [19]

[11] Reg. Number: H1,797

Mosser et al.

[45] Published: Jul. 6, 1999

[54] LINEAR FREQUENCY MODULATION APPARATUS AND TECHNIQUE

[75] Inventors: Richard P. Mosser; William H. Suder, III, both of Agoura; Richard E. Pavek, Thousand Oaks, all of Calif.

[73] Assignee: The United States of America as represented by the Secretary of the Navy, Washington, D.C.

[21] Appl. No.: 06/553,902

[22] Filed: Nov. 21, 1983

[51] Int. Cl.[6] ..... H03B 23/00

[52] U.S. Cl. ..... 367/102

[58] Field of Search ..... 343/14; 331/178, 331/17, 23; 332/18

[56] References Cited

U.S. PATENT DOCUMENTS

| | | | |
|---|---|---|---|
| 3,514,718 | 5/1970 | Newton | 332/19 X |
| 3,992,679 | 11/1976 | Isono | 331/17 X |
| 4,038,612 | 7/1977 | Borofka et al. | 331/178 |
| 4,205,316 | 5/1980 | Peperone | 343/14 |
| 4,245,196 | 1/1981 | Peebles, Jr. et al. | 331/178 |
| 4,310,809 | 1/1982 | Buck et al. | 331/117 D |

*Primary Examiner*—Daniel T. Pihulic
*Attorney, Agent, or Firm*—Robert W. Adams

[57] ABSTRACT

Linear frequency modulation having a large time-bandwidth product and an extremely linear frequency versus time waveform, is provided by a feedback technique utilizing a linear ramp voltage generator whose output is summed with a correction voltage to drive a voltage controlled oscillator to output the LFM waveform. Part of the LFM waveform is fed back through a digital discriminator for error signal generation and comparison with a preset value associated with the output slope linearity, thus yielding the basis for generating the correction voltage.

5 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

LINEAR FREQUENCY MODULATION APPARATUS AND TECHNIQUE

BACKGROUND OF THE INVENTION

The present invention relates to the broad field of FM waveform generation and more particularly to the field of linear frequency modulation. In even greater particularity, the present invention relates to linear frequency modulation having a large time-bandwidth product and an extremely linear frequency versus time waveform.

Previous known methods of linear frequency modulation could generate extremely linear frequency versus time waveforms for very short times only, or they could generate long frequency versus time waveforms with relatively poor linearity. Utilized in some of the prior art was a 1.0 GHz clock-rate scheme in which a closed loop system would be clocked at a 1.0 GHz rate; however, inherent in such a scheme are problems with reliable clocking of digital devices at the 1.0 GHz rate.

Another scheme for achieving the desired time-bandwidth product was digital computation with a single sideband generator; however, this method required a 10ns digital to analog converter and sample and hold circuits. Also, the scheme required phase matching over an 8 megahertz range within 1° in the filters and mixers of the single sideband generator.

Another method is the use of digitally controlled X-band phase shifters; however, this method encounters problems in the precise timing in the phase shifters and the number of bits necessary to drive the phase shifters.

The closest prior art would be the use of analog frequency modulators using an analog feedback circuit, wherein the major problem is the lock-up time required for the loop between LFM strokes which yields a lower duty factor than desired in utilization.

SUMMARY OF THE INVENTION

The present invention overcomes the difficulties in providing a linear frequency versus time waveform having the required time-bandwidth product by utilizing a closed loop path which contains a forward analog path for generating the output frequency followed by an error signal generator utilizing a surface acoustic wave device and a digital feedback path to said forward analog path.

It is an object of the invention to provide an extremely linear frequency modulation versus time waveform with a large time-bandwidth product.

Another object of the invention is to provide such a linear frequency modulation with multiple sweep rates.

Yet another object of the invention is to provide such linear frequency modulation with variable polarity, such that an upstroke or downstroke frequency modulation versus time relationship may be selected.

These and other objects, features and advantages of the invention will become apparent to the artisan from a study of the description of the preferred embodiment and the appended Figures.

DESCRIPTION OF THE PREFERRED EMBODIMENT

The technique and mechanization hereafter described is most useful in LFM radar applications, in that it allows the formation of range gates with a relatively long ambiguous range. Further, the variable slope or polarity aspect allows the formation of adaptive range gates. Also, the invention provides the capability of moving interference such as clutter away from the target in frequency when the clutter has appropriate range and range rates.

Figure 2:
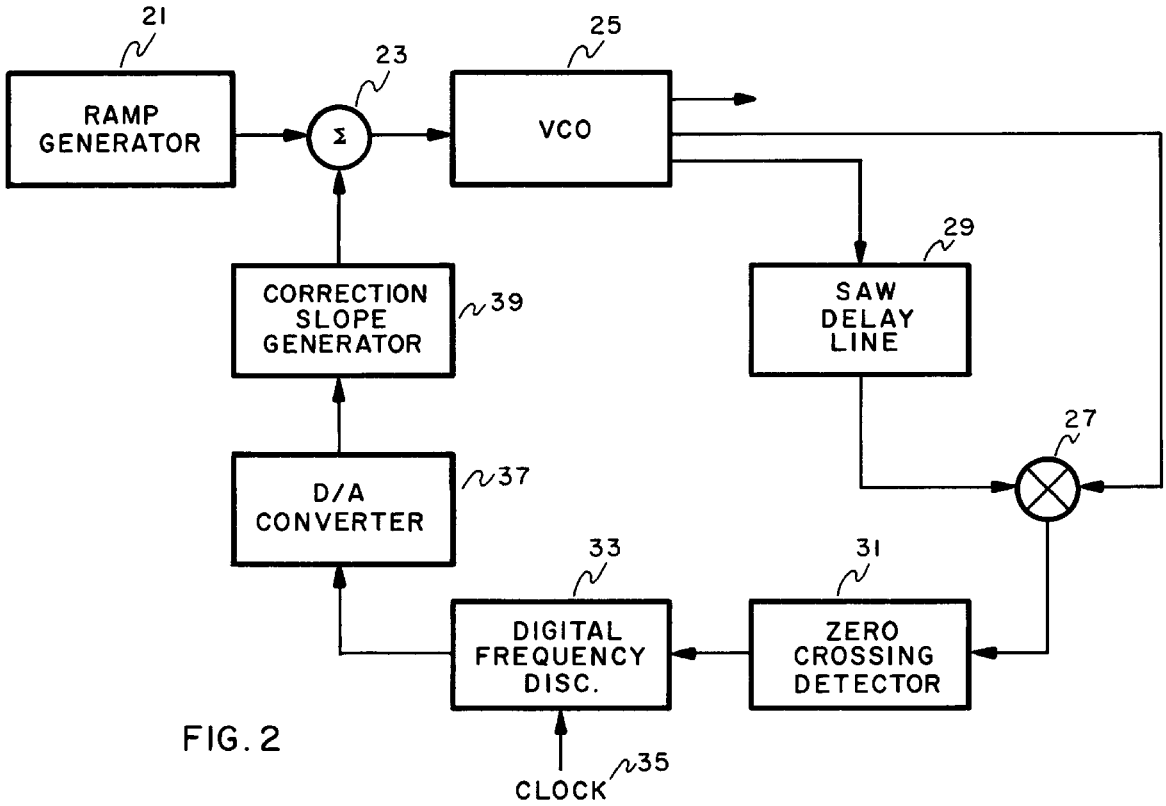
FIG. 2 is a block diagram of the mechanization of the invention.
Figure 1:
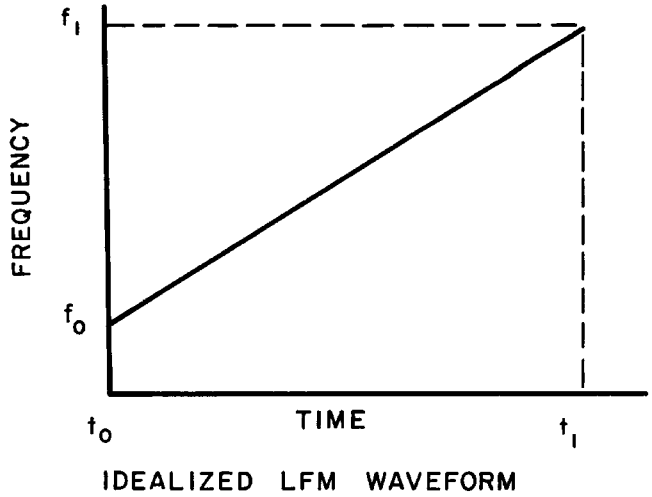
FIG. 1 is a representation of the desired frequency rate of change characteristics of the ideal LFM waveform.

With reference to FIG. 1, the waveform 10 represents the idealized linear characteristics of an upslope frequency modulation versus time waveform where the frequency ranges from an $f_0$ to $f_1$ over the time interval $t_0$ to $t_1$. A relatively large time ($t_1$-$t_0$) - bandwidth ($f_1$-$f_0$) product may be attained through a technique utilizing the mechanization shown in FIG. 2.

Ramp generator 21 is a voltage versus time waveform generator. Preferentially it comprises integrators whose output is a relatively linear voltage versus time waveform. The output of the ramp generator can have five different voltage versus time rates, and can be either an increasing voltage versus time waveform or a decreasing voltage versus time waveform. This output is applied to a summing circuit 23 whose other input is the feedback error signal from the feedback loop. The summing circuit output is the input to a highly linear voltage controlled oscillator (VCO) 25 whose output is a linear frequency versus time waveform, and is accomplished using a hyper abrupt varactor. The output of VCO 25 is the LFM waveform supplied to the system of which the present invention is a subassembly. VCO 25 also has two outputs to the feedback loop.

One of the VCO 25 outputs is an undelayed output to a mixer 27, while the other is a delayed path through a surface acoustic wave (SAW) delay line 29 to mixer 27. SAW delay line 29 serves as an error signal generator such that the output of mixer 27 is a frequency that is proportional to the rate of the frequency change of VCO 25. It may be noted that a measure of the linearity of the VCO output could be accomplished by measuring the frequency deviation at the output of mixer 27. However, following mixer 27 is a zero crossing detector 31 which converts the analog sinusoidal signal output of mixer 27 into a square wave digital signal that can be processed by a digital frequency discriminator 33.

Discriminator 33 compares the square wave from zero crossing detector 31 to a value preset for each available slope rate. Discriminator 33 is clocked by a high frequency clock 35 that varies up to 48 megahertz, depending upon the slope rate, in the preferred embodiment. The output of discriminator 33 is accumulated for each sample time and applied to the system through a digital to analog converter 37. The analog output of converter 37 is applied to a correction slope generator 39 whose purpose is to provide loop compensation and stability to the loop. The output of generator 39 is the second input to summing circuit 23, thus closing the loop.

Thus it can be seen that in operation the technique requires generating an analog signal to output a linear frequency modulation waveform, delaying part of said output to generate an error signal for deriving a signal proportionate to the rate of change of said output frequency; converting said proportionate signal into a digital waveform; comparing said digital waveform to a predetermined value to yield a digital variance output; converting said digital output to an analog slope correction waveform and stabilizing the generation of said LFM waveform by the introduction of said slope correction waveform. It will be appreciated that each of the steps of the technique may be further delineated by the functional performance of the elements hereinabove described.

While a preferred embodiment has been described, it should be understood that said description is intended as an illustration rather than a limitation, and that the invention encompasses such changes, modifications, and alterations as are encompassed by the scope and spirit of the appended claims.

What is claimed is:

1. An apparatus for generating selectable linear frequency versus time waveforms comprising, in combination:

an analog forward path having input and output means;

an error signal generator receiving the output of said analog forward path and having an output that is proportional to the rate of change in frequency of the output of said analog forward path; and a feedback path receiving the output of said error signal generator, connected to an input of said forward path for supplying a feedback signal, and having means for providing a sample period determined by the slope selected for said waveform, and digitally comparing during said period said error signal to a value determined by said slope.

2. The apparatus of claim 1 wherein said analog forward path comprises:

means for generating a linear voltage ramp having an output;

means for summing said voltage generating means output with said feedback signal; and means for varying frequency of a signal over time in an extremely linear manner in accordance with a voltage signal input thereto from said summing means.

3. The apparatus of claim 1 wherein said error signal generator comprises:

a surface acoustic wave delay line receiving an input from said analog forward path and having an output derived from the output thereof;

means for deriving a signal proportionate to the rate of change in frequency of the output of said analog forward path, having inputs from said surface acoustic wave delay line and said analog forward path.

4. The apparatus of claim 1 wherein said feedback path comprises:

means for converting the output of said error signal generator into a digital waveform;

means for comparing said digital waveform to a predetermined value associated with the linearity of said frequency versus time waveform, outputting a digital signal related thereto; and means for converting said digital signal into an analog voltage for input into said analog forward path to provide feedback loop stability to the analog forward path output.

5. Apparatus for producing a linear frequency ramp, comprising:

a voltage controlled oscillator providing a relatively linear frequency versus time waveform at its output responsive to the voltage of a signal at its input;

a first waveform generator producing a relatively linear ramp signal of voltage versus time at its output, wherein the slope of said ramp is selectable from a predetermined set of voltage versus time rates;

a second waveform generator providing the error signal of a feedback circuit at its output to correct the slope of the output signal of said voltage controlled oscillator;

a summing circuit coupled to said outputs of said first and said second waveform generators for combining said error signal with said relatively linear ramp signal of voltage versus time, and coupled to said input of said voltage controlled oscillator;

means in said feedback circuit coupled to an output of said voltage controlled oscillator for providing a frequency signal that is proportional to the rate of the frequency change in the output of said voltage controlled oscillator;

means in said feedback circuit coupled to said frequency signal providing means for converting said proportional signal into a square wave digital signal;

means in said feedback circuit coupled to said converting means for providing a sample period determined by the slope selected for the ramp of said first waveform generator, and comparing during said period said square wave digital signal to a value determined by said slope; and means in said feedback circuit coupled to said comparing means for converting the results of said comparison to a digital signal and coupling said digital signal to said second waveform generator.

* * * * *